(12) United States Patent
Takeuchi et al.

(10) Patent No.: US 6,876,535 B2
(45) Date of Patent: Apr. 5, 2005

(54) CERAMIC CAPACITOR, METHOD FOR PRODUCING THE SAME, AND DIELECTRIC MULTILAYER DEVICE

(75) Inventors: Takayuki Takeuchi, Ibaraki (JP); Masahiro Yamaoka, Tondabayashi (JP); Emiko Kawahara, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/678,925

(22) Filed: Oct. 3, 2003

(65) Prior Publication Data

US 2004/0070919 A1 Apr. 15, 2004

(30) Foreign Application Priority Data

Oct. 10, 2002 (JP) ........................................ 2002-297286

(51) Int. Cl.[7] ............................. H01G 4/005; H01G 4/06
(52) U.S. Cl. ...................... 361/303; 361/311; 29/25.42
(58) Field of Search ...................... 361/301.4, 303–305, 361/306.1, 306.3, 311–312, 763; 29/25.42; 156/89.12

(56) References Cited

U.S. PATENT DOCUMENTS 3,896,354 A * 7/1975 Coleman et al. ......... 361/321.2

6,153,290 A * 11/2000 Sunahara ..................... 428/210

FOREIGN PATENT DOCUMENTS

| JP | 60-89912 | 5/1985 |
| JP | 2002-222730 | 8/2002 |

* cited by examiner

*Primary Examiner*—Eric Thomas
(74) *Attorney, Agent, or Firm*—Merchant & Gould P.C.

(57) ABSTRACT

A ceramic capacitor includes: a first conductive pattern; a second conductive pattern and a dielectric layer, the first conductive pattern and the second conductive pattern being made of a conductor and provided so as to oppose each other and sandwich the dielectric layer therebetween. The first conductive pattern and the second conductive pattern are different in area from each other, where the second conductive pattern is smaller than the first conductive pattern, and a portion where the first conductive pattern and the second conductive pattern overlap each other forms a capacitance portion. A first extended portion and a second extended portion made of the conductor are formed at both edges of the second conductive pattern so as to extend in mutually opposite directions. With this configuration, the ceramic capacitor with a reduced variation in capacitance value caused by displacement in lamination of green sheets can be provided.

14 Claims, 14 Drawing Sheets

CERAMIC CAPACITOR, METHOD FOR PRODUCING THE SAME, AND DIELECTRIC MULTILAYER DEVICE

BACKGROUND OF THE INVENTION

1. Field of the Invention

The present invention generally relates to a ceramic capacitor, and more specifically relates to a ceramic capacitor with low capacitance that is improved so that mass production of the same can be accomplished with excellent reproducibility and with uniform properties. The present invention also relates to a method for producing a ceramic capacitor with low capacitance that is improved so as to increase the yield. The present invention further relates to a dielectric multilayer device using such a ceramic capacitor that is improved so as to stabilize the frequency characteristics.

2. Related Background Art

Conventionally, ceramic capacitors and dielectric multilayer devices using the same have been used mainly for communication equipment. FIG. 16 is a block diagram of communication equipment including a dielectric multilayer device such as a filter therein, which shows a mobile phone, for example. The mobile phone is equipped with a transmitter 100, a receiver 101, a base band unit 11, a branching filter 2, a radiator 6 and an antenna 1. The transmitter 100 includes a frequency conversion unit 5, a filter 4 and a transmission amplifier 3. The receiver 101 includes a reception amplifier 7, a filter 8, a frequency conversion unit 9 and a filter 10. The branching filter 2, or the filters 4, 8 or 10 may be individually constituted as an independent multilayer dielectric device, or may be provided integrally within the transmitter 100 or the receiver 101. As the filters 4, 8, and 10 and a filter built into the branching filter 2, a low pass filter, a high pass filter, a band pass filter, a band elimination filter and the like are used. These filters are used for allowing signals within a predetermined frequency band to pass through or to be attenuated.

FIG. 17 shows an equivalent circuit diagram showing one example of a low pass filter. The low pass filter includes an inductor 15 and capacitors 12, 13 and 14.

FIG. 18 schematically shows a method for producing the above-stated low pass filter by a sheet lamination method. Green sheets 16 to 21 provided with conductive patterns 22 to 27, respectively, are prepared, where the green sheet is a dielectric raw material sheet made of ceramic containing a binder. These sheets are aligned using alignment marks 110 and are laminated, followed by sintering so as to obtain the low pass filter. Not only the low pass filter but any filters are made up of some capacitors as shown in FIG. 17. Frequency characteristics of a filter are determined by the capacitance values of these capacitors.

FIG. 19 schematically explains a first conventional technology (See JP 60(1985)-89912 A (page 5, FIG. 4), for example) in which a capacitor is formed by the sheet lamination method. For the sake of clarity, a green sheet serving as a dielectric layer is not illustrated in these drawings. As shown in FIG. 19A, assuming that an area of a second conductive pattern 28 serving as an upper electrode is $S_0$, an interval between the upper electrode 28 and a first conductive pattern 29 serving as a lower electrode is d and a dielectric constant of the not-illustrated dielectric layer is $\varepsilon$, the capacitance $C_0$ is represented by the following formula (1):

$$C_0 = \varepsilon \times (S_0/d) \quad \text{(formula 1)}$$

As shown in FIG. 19B, in the conventional technology, the area $S_0$ of the second conductive pattern 28 and the area of the first conductive pattern 29 are made different to take into account possible displacement in lamination of the green sheets. That is to say, in the projection in a thickness direction of the dielectric layer (not illustrated), intervals L1, L2, L3 and L4 are provided between an outer edge of the second conductive pattern 28 and an outer edge of the first conductive pattern 29 as shown in the drawing.

Such provision of a difference in area between opposed electrodes of a capacitor is disclosed in other patent literature also (See JP 2002-222730 A (page 4, FIG. 3), for example).

As shown in FIG. 19C, a lead 30 is attached to the second conductive pattern 28 for the connection with another circuit (not illustrated). Since the lead 30 is a conductor, the first conductive pattern 29 and a portion 30a of the lead 30 that overlaps the first conductive pattern 29 forms capacitance $C_1$. In this case, the overall capacitance of the capacitor will be given by the following formula 2:

$$C = C_0 + C_1 \quad \text{(formula 2)}$$

The capacitor according to the first conventional example is formed as stated above. This configuration does not pose any problems if an area $S_1$ of the overlapping portion 30a of the lead 30 and the first conductive pattern 29 is constant.

However, due to the displacement during the lamination of green sheets, there may be a case, as shown in FIG. 20A, where the second conductive pattern 28 is displaced toward the left side in the drawing so as to increase the area of the overlapping portion 30a or conversely there may be another case, as shown in FIG. 20B, where the second conductive pattern 28 is displaced toward the right side in the drawing so as to decrease the area of the overlapping portion 30a. Even if the accuracy in alignment during the lamination is improved, it is impossible to make the displacement in lamination zero. Such displacement causes a fluctuation in the capacitance $C_1$, which generates a variation in the capacitance C. Moreover, such variation in the capacitance C of the capacitor leads to the failure in mass production of capacitors with uniform capacitance, thus degrading the yield. Such a problem is generated also in the case where the second conductive pattern 28 is displaced in the θ rotational direction (rotational displacement in a horizontal plane) during the lamination of sheets.

The above-stated variation poses a serious problem especially when a miniaturized and low-capacitance capacitor is produced, where the areas of the second conductive pattern 28 and the first conductive pattern 29 are reduced as shown in FIG. 21A. That is to say, in the case of a small area $S_0$, the fluctuation in the area of the overlapping portion 30a has a great influence on the capacitance value C of the capacitor.

Then, in a second conventional example, as shown in FIG. 21B, an area of a second conductive pattern 28 is increased (e.g., to twice) and a distance between the second conductive pattern 28 and a first conductive pattern 29 is increased (e.g., to twice) in order to reduce a variation in capacitance value due to the displacement in lamination of green sheets in a low-capacitance capacitor that is formed in a dielectric multilayer device. With this configuration, an area of the capacitance formation portion of a main body is increased, and therefore a capacitance value $C_0$ of the capacitance formation portion of the main body is increased. Consequently, even if the green sheets are displaced during the lamination, capacitance $C_1$ of an overlapping portion of a lead portion 30 and the first conductive pattern 29 becomes smaller relative to the capacitance value $C_0$ of the capacitance formation portion of the main body, so that a variation in the capacitance $C_1$ can be ignored. As a result, even if the green sheets are displaced during the lamination, a variation in the capacitance value C of the capacitor can be ignored.

However, according to the second conventional method, the area of the second conductive pattern 28 is increased, and the distance between the second conductive pattern 28 and the first conductive pattern 29 is increased, so that this method poses a problem for miniaturization of the element.

In order to make a dielectric multilayer device smaller and thinner, elements formed on each circuit should be formed as compact as possible. On the other hand, as long as the sheet lamination method is employed, displacement of green sheets is inevitable during the lamination. Therefore, according to the above-stated two conventional methods, there is a limit in miniaturization when a low-capacitance capacitor is formed by the sheet lamination method.

SUMMARY OF THE INVENTION

Therefore, with the foregoing in mind, it is an object of the present invention to provide a ceramic capacitor with a reduced variation in capacitance value.

It is another object of the present invention to provide a miniaturized and low-capacitance ceramic capacitor with a reduced variation in capacitance value.

It is still another object of the present invention to provide a method for producing a ceramic capacitor that is improved so as to accomplish mass production of the capacitors with excellent reproducibility and with uniform properties.

It is a further object of the present invention to provide a method for producing a ceramic capacitor that is improved so as to increase the yield.

It is a still further object of the present invention to provide a dielectric multilayer device using such a low-capacitance ceramic capacitor with a reduced variation in capacitance value, which is improved so as to stabilize the frequency characteristics.

A ceramic capacitor of the present invention includes: a first conductive pattern; a second conductive pattern and a dielectric layer. The first conductive pattern and the second conductive pattern are made of a conductor and provided so as to oppose each other and sandwich the dielectric layer therebetween. The first conductive pattern and the second conductive pattern are different in area from each other, with the second conductive pattern smaller than the first conductive pattern. A portion where the first conductive pattern and the second conductive pattern overlap each other forms a capacitance portion. A first extended portion and a second extended portion made of the conductor are formed at both edges of the second conductive pattern so as to extend in mutually opposite directions.

A method for producing a ceramic capacitor of the present invention includes the steps of forming a first conductive pattern serving as one electrode of the capacitor on a first green sheet; forming a second conductive pattern serving as the other electrode of the capacitor on a second green sheet; and laminating the first green sheet and the second green sheet, followed by sintering of the same. In projection in a direction of the lamination, a main part of the second conductive pattern is formed smaller than the first conductive pattern so that an outer edge of the main part of the second conductive pattern does not extend beyond an outer edge of the first conductive pattern, and a first extended portion and a second extended portion are formed at both opposed edges of the second conductive pattern, the first extended portion and the second extended portion extending in mutually opposite directions and, in the projection in the lamination direction, each of the first extended portion and the second extended portion extending outwardly beyond the outer edge of the first conductive pattern.

Another method for producing a ceramic capacitor includes the steps of forming a first conductive pattern serving as one electrode of the capacitor on a first green sheet; forming a second conductive pattern serving as the other electrode of the capacitor on a second green sheet; and laminating the first green sheet and the second green sheet, followed by sintering of the same. An aperture is formed in the first conductive pattern so as to penetrate in a same direction as a direction of the lamination, and in projection of the lamination direction, the second conductive pattern is formed with a strip-shaped pattern whose central portion lies across the aperture of the first conductive pattern and both end portions overlap the first conductive pattern.

A dielectric multilayer device of the present invention includes: a plurality of dielectric layers and a plurality of conductive patterns, which are laminated alternately in a vertical direction having an interval therebetween; and a capacitor that is built in the dielectric multilayer device. The capacitor includes: a first dielectric layer; and a first conductive pattern and a second conductive pattern made of a conductor provided so as to oppose each other and sandwich the first dielectric layer therebetween in a direction of a thickness of the first dielectric layer. In projection in the thickness direction, the second conductive pattern is made smaller than the first conductive pattern so that an outer edge of the second conductive pattern does not extend beyond an outer edge of the first conductive pattern, a first extended portion and a second extended portion made of the conductor are provided at both opposed edges of the second conductive pattern so as to extend in mutually opposite directions, and, in the projection in the thickness direction, each of the first extended portion and the second extended portion extends outwardly beyond the outer edge of the first conductive pattern.

Another dielectric multilayer device of the present invention includes: a plurality of dielectric layers and a plurality of conductive patterns, which are laminated alternately in a vertical direction having an interval therebetween; and a capacitor that is built in the dielectric multilayer device. The capacitor includes: a first dielectric layer; and a first conductive pattern and a second conductive pattern made of a conductor provided so as to oppose each other and sandwich the first dielectric layer therebetween in a direction of a thickness of the first dielectric layer. An aperture is formed in the first conductive pattern so as to penetrate in a same direction as the direction of the thickness of the first dielectric layer, and in projection of the thickness direction, the second conductive pattern is formed with a strip-shaped pattern whose central portion lies across the aperture of the first conductive pattern and both end portions overlap the first conductive pattern.

DETAILED DESCRIPTION OF THE INVENTION

Figure 1A:
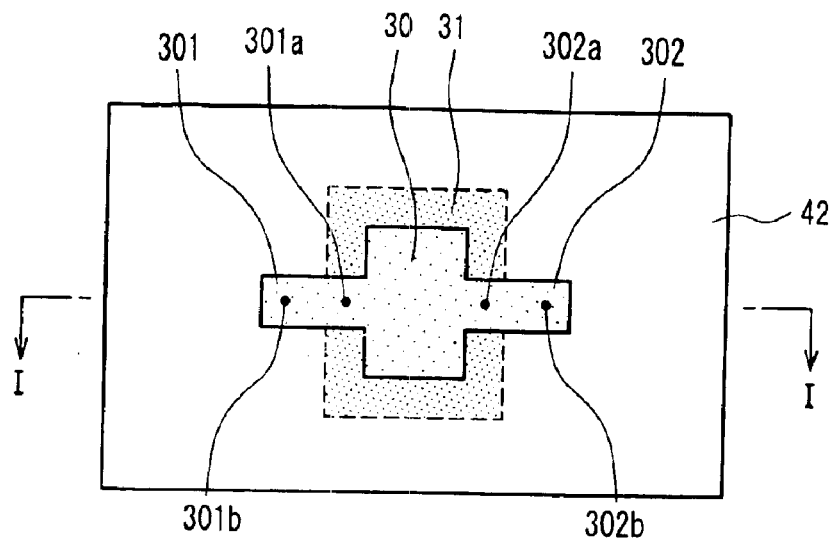
FIG. 1A shows a ceramic capacitor according to Embodiment 1 of the present invention, which is a view projected in a thickness direction of a dielectric layer.

In a ceramic capacitor of the present invention, a first conductive pattern and a second conductive pattern made of a conductor are provided so as to oppose each other and sandwich a dielectric layer therebetween in a thickness direction of the dielectric layer. In projection in the thickness direction, a main part of the second conductive pattern is formed smaller than the first conductive pattern so that an outer edge of the main part of the second conductive pattern does not extend beyond an outer edge of the first conductive pattern. A first extended portion and a second extended portion made of the conductor, which are not included in the main part, are formed at both opposed edges of the second conductive pattern so as to extend in mutually opposite directions. In the projection in the thickness direction, the first extended portion and the second extended portion extend outwardly beyond the outer edge of the first conductive pattern. With this configuration, since the first extended portion and the second extended portion made of the conductor are provided at the both opposed edges of the second conductive pattern so as to extend in mutually opposite directions, and in the projection in the thickness direction, the first extended portion and the second extended portion extend outwardly beyond the outer edge of the first conductive pattern, the total opposed area of an upper electrode and a lower electrode of the ceramic capacitor after sintering does not change even when green sheets are displaced during the lamination of the green sheets.

According to a preferred embodiment of the present invention, the first extended portion and the second extended portion are formed so as to have widths narrower than a width of the first conductive pattern. With this configuration, an area of portions extending outwardly beyond the first conductive pattern can be made small.

In a ceramic capacitor of the present invention, a first conductive pattern and a second conductive pattern made of a conductor are provided so as to oppose each other and sandwich a dielectric layer therebetween in a thickness direction of the dielectric layer. The first conductive pattern is provided with an aperture that is formed so as to penetrate in the same direction as the thickness direction of the dielectric layer. In projection of the thickness direction, the second conductive pattern is formed with a strip-shaped pattern whose central portion lies across the aperture and both end portions overlap the first conductive pattern. This configuration allows an opposed area between an upper electrode and a lower electrode to be reduced, thus realizing a capacitor with lower capacitance. In addition, since the both end portions of the second conductive pattern overlap the first conductive pattern, the total opposed area of the upper electrode and the lower electrode does not change even when green sheets are displaced during the lamination of the green sheets.

According to a preferred embodiment of the present invention, the second conductive pattern formed in the strip shape has a swelling portion at an overlapping portion with the aperture of the first conductive pattern, the swelling portion having an increased width compared with other portions and for the connection with a via electrode. This configuration facilitates the formation of the via electrode at this portion.

As an application example of the present invention, a third conductive pattern may be formed integrally at least at one end portion of the second conductive pattern, the third conductive pattern overlapping the first conductive pattern so as to form capacitance. In this example, there is no need to form a planar shape of the second conductive pattern with bilateral symmetry.

In the present invention, it is preferable that the first extended portion and the second extended portion of the second conductive pattern have the same width. With this configuration, the total opposed area of the upper electrode and the lower electrode does not change even when displacement occurs during the lamination. In addition, preferably, the first extended portion and the second extended portion of the second conductive pattern are present in a same line or in parallel lines.

In a method for producing a ceramic capacitor of the present invention, firstly, a first conductive pattern serving as one electrode of the capacitor is formed on a first green sheet. Then, a second conductive pattern serving as the other electrode of the capacitor is formed on a second green sheet. The first green sheet and the second green sheet are laminated, and then these are subjected to sintering. In such a method for producing a ceramic capacitor, in projection in a direction of the lamination, the second conductive pattern is formed smaller than the first conductive pattern so that an outer edge of the second conductive pattern does not extend beyond an outer edge of the first conductive pattern, and a first extended portion and a second extended portion are formed at both opposed edges of the second conductive pattern, the first extended portion and the second extended portion extending in mutually opposite directions and, in the projection in the lamination direction, each of the first extended portion and the second extended portion extending outwardly beyond the outer edge of the first conductive pattern.

According to the present invention, the first extended portion and the second extended portion are formed at the both opposed edges of the second conductive pattern, the first extended portion and the second extended portion extending in mutually opposite directions and, in the projection in the lamination direction, each of the first extended portion and the second extended portion extending outwardly beyond the outer edge of the first conductive pattern. Therefore the total opposed area of an upper electrode and a lower electrode does not change even when green sheets are displaced during the lamination of the green sheets.

According to a preferred embodiment of the present invention, the first extended portion and the second extended portion are formed so as to have widths narrower than a width of the first conductive pattern. With this configuration, an area of portions extending outwardly beyond the first conductive pattern can be made small.

In another method for producing a ceramic capacitor of the present invention, firstly, a first conductive pattern serving as one electrode of the capacitor is formed on a first green sheet. Then, a second conductive pattern serving as the other electrode of the capacitor is formed on a second green sheet. The first green sheet and the second green sheet are laminated, and then these are subjected to sintering. In such a method for producing a ceramic capacitor, an aperture is formed in the first conductive pattern so as to penetrate in a same direction as a direction of the lamination. In addition, in projection in the lamination direction, the second conductive pattern is formed with a strip-shaped pattern whose central portion lies across the aperture and both end portions overlap the first conductive pattern. With this configuration, the both end portions of the second conductive pattern overlap the first conductive pattern, and the total opposed area of the upper electrode and the lower electrode does not change even when displacement occurs during the lamination. In addition, since the first conductive pattern has the aperture therein, the opposed area of the upper electrode and the lower electrode becomes small, thus reducing the capacitance thereof.

A dielectric multilayer device of the present invention includes: a plurality of dielectric layers and a plurality of conductive patterns, which are laminated alternately in a vertical direction having an interval therebetween; and a capacitor that is built in the dielectric multilayer device. The capacitor includes: a first dielectric layer; and a first conductive pattern and a second conductive pattern made of a conductor provided so as to oppose each other and sandwich the first dielectric layer therebetween in a direction of a thickness of the first dielectric layer. In projection in the thickness direction, the second conductive pattern is made smaller than the first conductive pattern so that an outer edge of the second conductive pattern does not extend beyond an outer edge of the first conductive pattern. A first extended portion and a second extended portion made of the conductor are provided at both opposed edges of the second conductive pattern so as to extend in mutually opposite directions. In the projection in the thickness direction, each of the first extended portion and the second extended portion extends outwardly beyond the outer edge of the first conductive pattern.

According to this dielectric multilayer device, even when a size of the capacitor that is built therein is reduced, a variation in capacitance value caused by displacement in lamination can be ignored. Therefore, the capacitor can be formed compact in size.

According to a preferred embodiment of the present invention, the first extended portion and the second extended portion are formed so as to have widths narrower than a width of the first conductive pattern. With this example, since the widths of the first extended portion and the second extended portion are made narrower than the width of the first conductive pattern, an increase in capacitance of the capacitor can be reduced.

According to a further preferred embodiment of the present invention, the first dielectric layer constituting the capacitor is formed thinner than any dielectric layers sandwiched between conductive patterns other than the first and the second conductive patterns.

According to the present invention, the capacitor can be miniaturized, and therefore the present invention preferably is applicable to a capacitor in a dielectric multilayer device, whose miniaturization is especially demanded.

Another dielectric multilayer device of the present invention includes: a plurality of dielectric layers and a plurality of conductive patterns, which are laminated alternately in a vertical direction having an interval therebetween; and a capacitor that is built in the dielectric multilayer device. The capacitor includes: a first dielectric layer; and a first conductive pattern and a second conductive pattern made of a conductor provided so as to oppose each other and sandwich the first dielectric layer therebetween in a direction of a thickness of the first dielectric layer. An aperture is formed in the first conductive pattern so as to penetrate in a same direction as the direction of the thickness of the first dielectric layer. In projection of the thickness direction, the second conductive pattern is formed with a strip-shaped pattern whose central portion lies across the aperture and both end portions overlap the first conductive pattern. According to this dielectric multilayer device, even when a size of the capacitor that is built therein is reduced, a variation in capacitance value caused by displacement in lamination can be ignored. Therefore, the capacitor can be formed compact in size.

According to a preferred embodiment of the present invention, the first dielectric layer constituting the capacitor is formed thinner than any dielectric layers sandwiched between conductive patterns other than the first and the second conductive patterns. With this configuration, the capacitor can be miniaturized, and therefore the present invention preferably is applicable to a capacitor in a dielectric multilayer device, whose miniaturization is especially demanded.

The present invention relates to radio equipment in which a dielectric multilayer device is incorporated. The dielectric multilayer device includes: a plurality of dielectric layers and a plurality of conductive patterns, which are laminated alternately in a vertical direction having an interval therebetween; and a capacitor that is built in the dielectric multilayer device. The capacitor includes: a first dielectric layer; and a first conductive pattern and a second conductive pattern made of a conductor provided so as to oppose each other and sandwich the first dielectric layer therebetween in a direction of a thickness of the first dielectric layer. In projection in the thickness direction, the second conductive pattern is made smaller than the first conductive pattern so that an outer edge of the second conductive pattern does not extend beyond an outer edge of the first conductive pattern. A first extended portion and a second extended portion made of the conductor are provided at both opposed edges of the second conductive pattern so as to extend in mutually opposite directions. In the projection in the thickness direction, each of the first extended portion and the second extended portion extends outwardly beyond the outer edge of the first conductive pattern. With this configuration, the frequency characteristics of the dielectric multilayer device that is incorporated therein can be stabilized.

According to a preferred embodiment of the present invention, the first extended portion and the second extended portion are formed so as to have widths narrower than a width of the first conductive pattern.

According to a further preferred embodiment of the present invention, the first dielectric layer constituting the capacitor is formed thinner than any dielectric layers sandwiched between conductive patterns other than the first and the second conductive patterns.

The present invention relates to radio equipment in which another dielectric multilayer device is incorporated. The dielectric multilayer device includes: a plurality of dielectric layers and a plurality of conductive patterns, which are laminated alternately in a vertical direction having an interval therebetween; and a capacitor that is built in the dielectric multilayer device. The capacitor includes: a first dielectric layer; and a first conductive pattern and a second conductive pattern made of a conductor provided so as to oppose each other and sandwich the first dielectric layer therebetween in a direction of a thickness of the first dielectric layer. An aperture is formed in the first conductive pattern so as to penetrate in a same direction as the direction of the thickness of the first dielectric layer. In projection of the thickness direction, the second conductive pattern is formed with a strip-shaped pattern whose central portion lies across the aperture and both end portions overlap the first conductive pattern. With this configuration, the frequency characteristics of the dielectric multilayer device that is incorporated therein can be stabilized.

According to a preferred embodiment of the present invention, the first dielectric layer constituting the capacitor is formed thinner than any dielectric layers sandwiched between conductive patterns other than the first and the second conductive patterns.

The ceramic capacitor of the present invention and a dielectric multilayer device using the same are effective for a thin device with an interval between electrodes (a thickness of dielectrics) not more than 12 $\mu$m. As for capacitance, the present invention is effective for a low capacitance ceramic capacitor with a capacitance not more than 5 pF.

According to the present invention, a ceramic capacitor with a reduced variation in capacitance value can be provided. A miniaturized and low-capacitance ceramic capacitor with a reduced variation in capacitance value can be provided. A method for producing a ceramic capacitor that is improved so as to accomplish mass production of the capacitors with excellent reproducibility and with uniform properties can be provided. A method for producing a ceramic capacitor that is improved so as to increase the yield can be provided. A dielectric multilayer device using such a low-capacitance ceramic capacitor with a reduced variation in capacitance value, which is improved so as to stabilize the frequency characteristics can be provided. Radio equipment in which the dielectric multilayer device with stable frequency characteristics is incorporated therein can be provided.

The following describes specific embodiments of the present invention, with reference to the drawings.

Embodiment 1

Figure 1B:
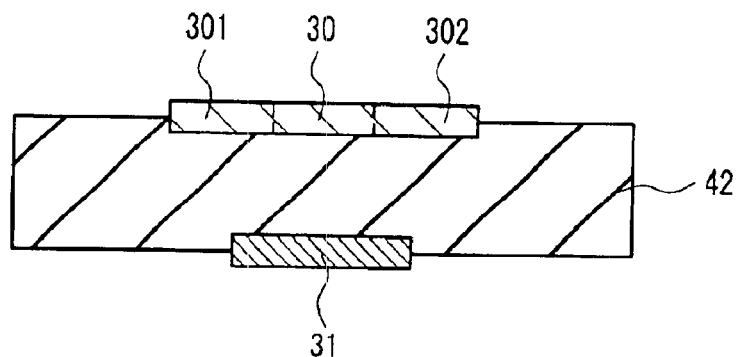
FIG. 1B is a cross-sectional view taken along the line I—I of FIG. 1A.

FIG. 1A is a plan view of a ceramic capacitor according to Embodiment 1, and FIG. 1B is a cross-sectional view taken along the line I—I of FIG. 1A.

As shown in FIGS. 1A to B, the ceramic capacitor according to Embodiment 1 includes a dielectric layer 42. A first conductive pattern 31 and a second conductive pattern 30 made of a conductor are provided so as to oppose each other and sandwich the dielectric layer 42 therebetween in a thickness direction of the dielectric layer 42. The first conductive pattern 31 serves as a lower electrode of the capacitor, and the second conductive pattern 30 serves as an upper electrode of the same.

As shown in FIG. 1A, in the projection in the thickness direction of the dielectric layer 42, the second conductive pattern 30 is made smaller than the first conductive pattern 31 so that an outer edge of the second conductive pattern 30 does not extend beyond an outer edge of the first conductive pattern 31. At both opposed edges of the second conductive pattern 30, a first extended portion 301 and a second extended portion 302 made of the same conductor are provided so as to extend in mutually opposite directions. Since each of the first extended portion 301 and the second extended portion 302 is made of the conductor, they form capacitance with the first conductive pattern 31. A thickness of the dielectric layer 42 preferably is 8 $\mu$m or more, which is a thickness after the baking process. Thicknesses of the first conductive pattern 31 and the second conductive pattern 32 preferably are each 5 to 20 $\mu$m. A length of one side of the second conductive pattern 30 is 80 $\mu$m or more, which is set so as to be an area for a desired capacitance value. Lengths of the first extended portion 301 and the second extended portion 302 of the second conductive pattern 30 preferably are each 50 $\mu$m or more. It is preferable that the first conductive pattern 31 is formed larger than the second conductive pattern 30 so as to have a width therebetween being not less than 50 $\mu$m at the narrowest portion in the projection in the thickness direction. The first conductive pattern 31 and the second conductive pattern 30 preferably are made of a metal selected from the group consisting of Ag, Cu, Au, Pt and Pd. The dielectric layer 42 preferably is made of $Bi_2O_3$—CaO—$Nb_2O_5$ base ceramic, $Bi_2O_3$—CaO—ZnO—$Nb_2O_5$ base ceramic, BaO—$TiO_2$—$Nd_2O_3$— glass base ceramic, $Al_2O_3$—MgO—$Gd_2O_3$ glass base ceramic and the like.

In the above-stated projection in the thickness direction, each of the first extended portion 301 and the second extended portion 302 extends beyond the outer edge of the first conductive pattern 31. Each width of the first extended portion 301 and the second extended portion 302 is made narrower than a width of the first conductive pattern 31. That is to say, the first extended portion 301 is made up of a portion 301a that overlaps the first conductive pattern 31 and a portion 301b that further extends from the overlapping portion 301a, which sticks out so as not to overlap the first conductive pattern 31. The second extended portion 302 is made up of a portion 302a that overlaps the first conductive pattern 31 and a portion 302b that further extends from the overlapping portion 302a, which sticks out so as not to overlap the first conductive pattern 31.

The second extended portion 302 is used as a lead for the connection with another circuit, for example. The first extended portion 301 may be formed as a dummy, or may be connected with still another circuit.

According to this embodiment, even when green sheets are displaced during the lamination (for example, the displacement of the second conductive pattern 30 to the right side in the drawing) so as to decrease an area of the overlapping portion 302a of the second extended portion 302 with the first conductive pattern 31, an area of the overlapping portion 301a of the first extended portion 301 with the first conductive pattern 31 is increased correspondingly. Therefore, even when green sheets are displaced during the lamination, the total opposed area of the upper electrode (including the second conductive pattern 30, the first extended portion 301 and the second extended portion 302) and the lower electrode (including the first conductive pattern 31) does not change. As a result, there is no variation in capacitance value due to the displacement in lamination of green sheets.

Such a method for suppressing the variation can exert its effect even when the upper electrode and the lower electrode are miniaturized. Therefore, when a low-capacitance capacitor is produced for which the miniaturization is inevitable, this embodiment is especially effective.

Note here that although the above description deals with the case where the green sheet is displaced in the lamination toward the right side in the drawing, even when the displacement is generated in the lamination so that the second conductive pattern 30 is rotated in the θ direction, the total opposed area of the upper electrode and the lower electrode does not change.

In addition, the provision of the stick-out portions 301b and 302b gives an adequate margin of the displacement in lamination of the green sheets.

Note here that the above embodiment exemplifies that each width of the first extended portion 301 and the second extended portion 302 is made narrower than the width of the first conductive pattern 31. This case is advantageous in the capacitance formed between the overlapping portion 301a or 302a and the first conductive pattern 31 being made smaller. However, this embodiment is not limited to such a case, and the widths of the first extended portion 301 and the second extended portion 302 may be equal to the width of the first conductive pattern 31. Even in this configuration, there is no variation in capacitance value due to the displacement in lamination of green sheets.

Additionally, the above embodiment exemplifies that the second conductive pattern 30 is constituted as the upper electrode and the first conductive pattern 31 is constituted as the lower electrode. However, this embodiment is not limited to this example, and the converse also is possible, that is, the second conductive pattern 30 may be constituted as the lower electrode and the first conductive pattern 31 may be constituted as the upper electrode.

Figure 2:
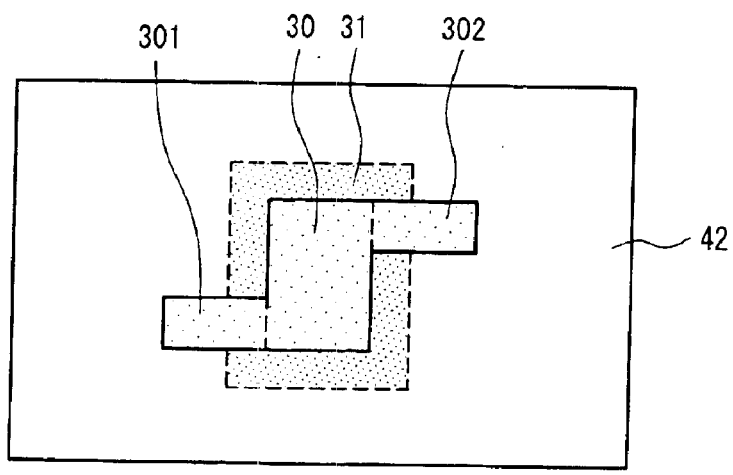
FIG. 2 shows another ceramic capacitor according to Embodiment 1 of the present invention, which is a view projected in a thickness direction of a dielectric layer.

FIG. 2 shows an application example of FIGS. 1A to B. Although the first extended portion 301 and the second extended portion 302 are present in the same line in FIGS. 1A to B, they are present in parallel lines in FIG. 2, from which the same effects as in the example of FIGS. 1A to B can be obtained.

Figure 3:
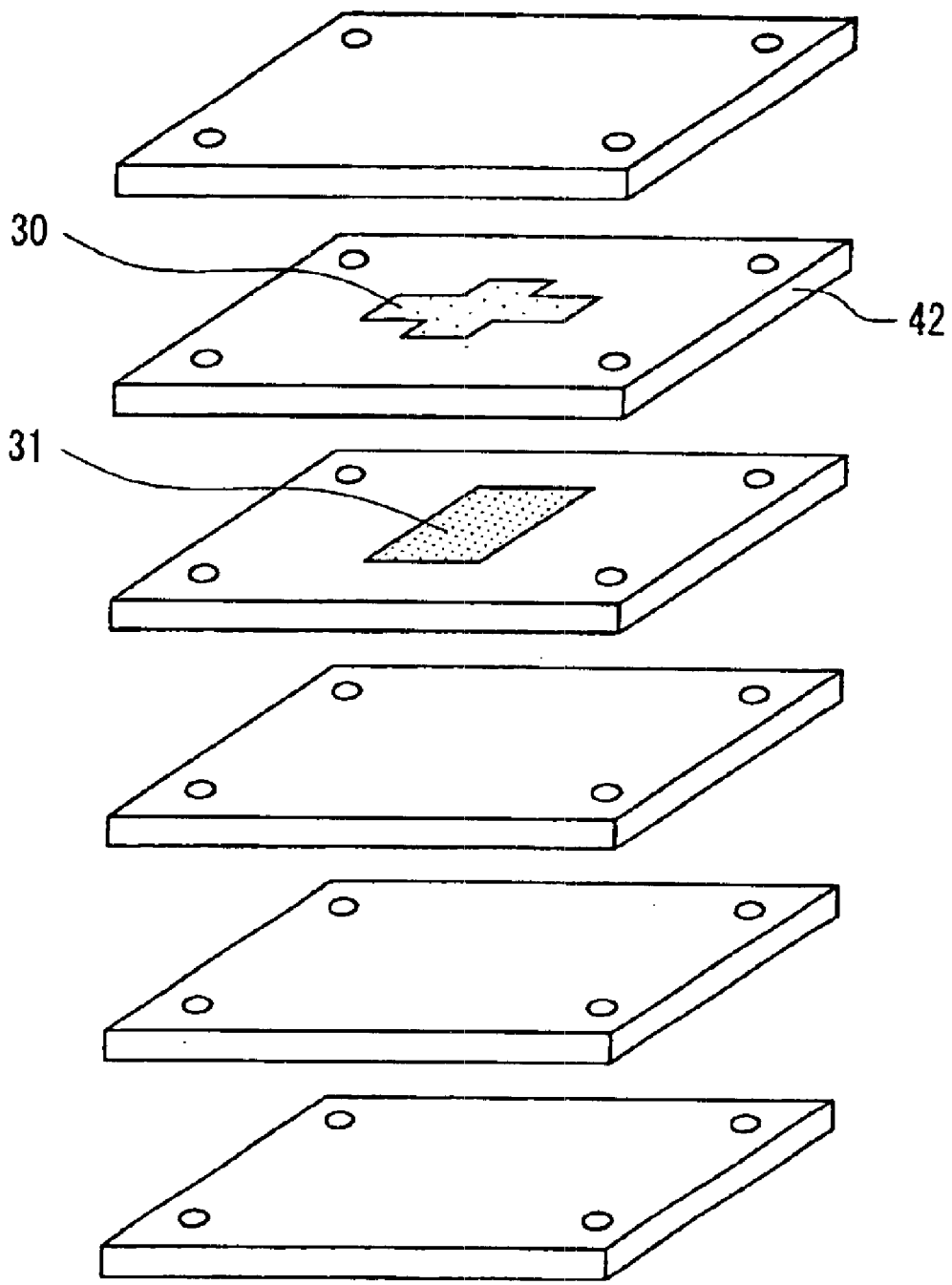
FIG. 3 schematically explains a method for producing the ceramic capacitor according to Embodiment 1 of the present invention.

FIG. 3 schematically shows a method for producing the ceramic capacitor according to Embodiment 1.

Each of green sheets as shown in FIG. 3 has a conductive pattern (not illustrated) formed thereon. A green sheet 42 corresponds to the dielectric layer 42 shown in FIG. 1B. On the green sheet 42, the second conductive pattern 30 serving as the upper electrode of the capacitor is applied. The conductive pattern 30 is formed by printing, for example.

On a green sheet located below the green sheet 42, the first conductive pattern 31 is applied. The plurality of green sheets are laminated, followed by sintering, so that a dielectric multilayer device is obtained in which a plurality of dielectric layers and a plurality of conductive patterns are laminated alternately in the vertical direction to have an interval therebetween, and a capacitor is built therein.

Figure 16:
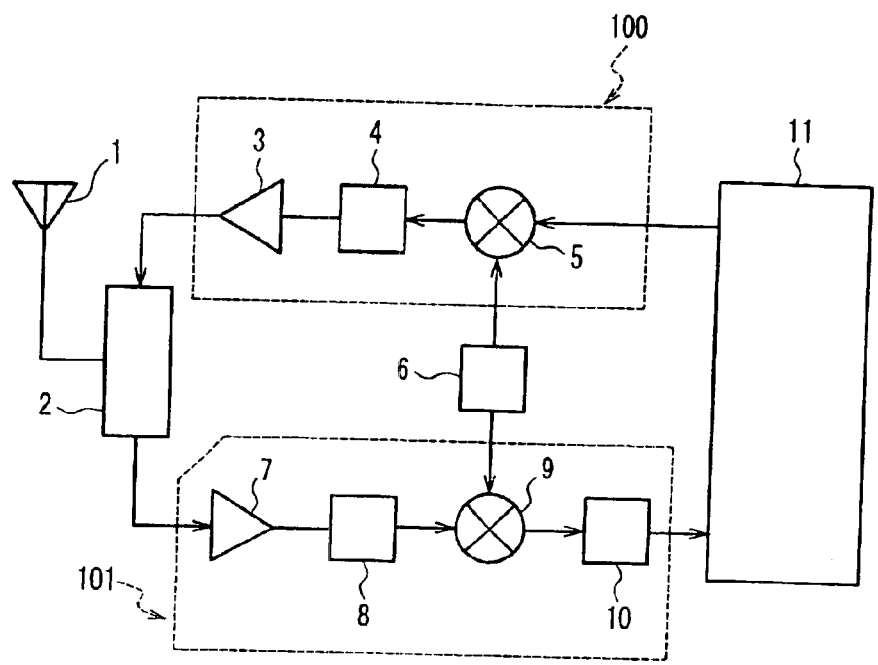
FIG. 16 is a block diagram of a mobile phone according to the conventional example and the present invention.
Figure 17:
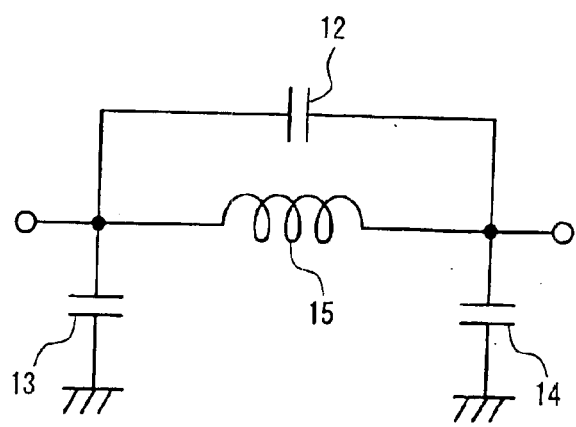
FIG. 17 is an equivalent circuit diagram of a filter used in the mobile phone.
Figure 18:
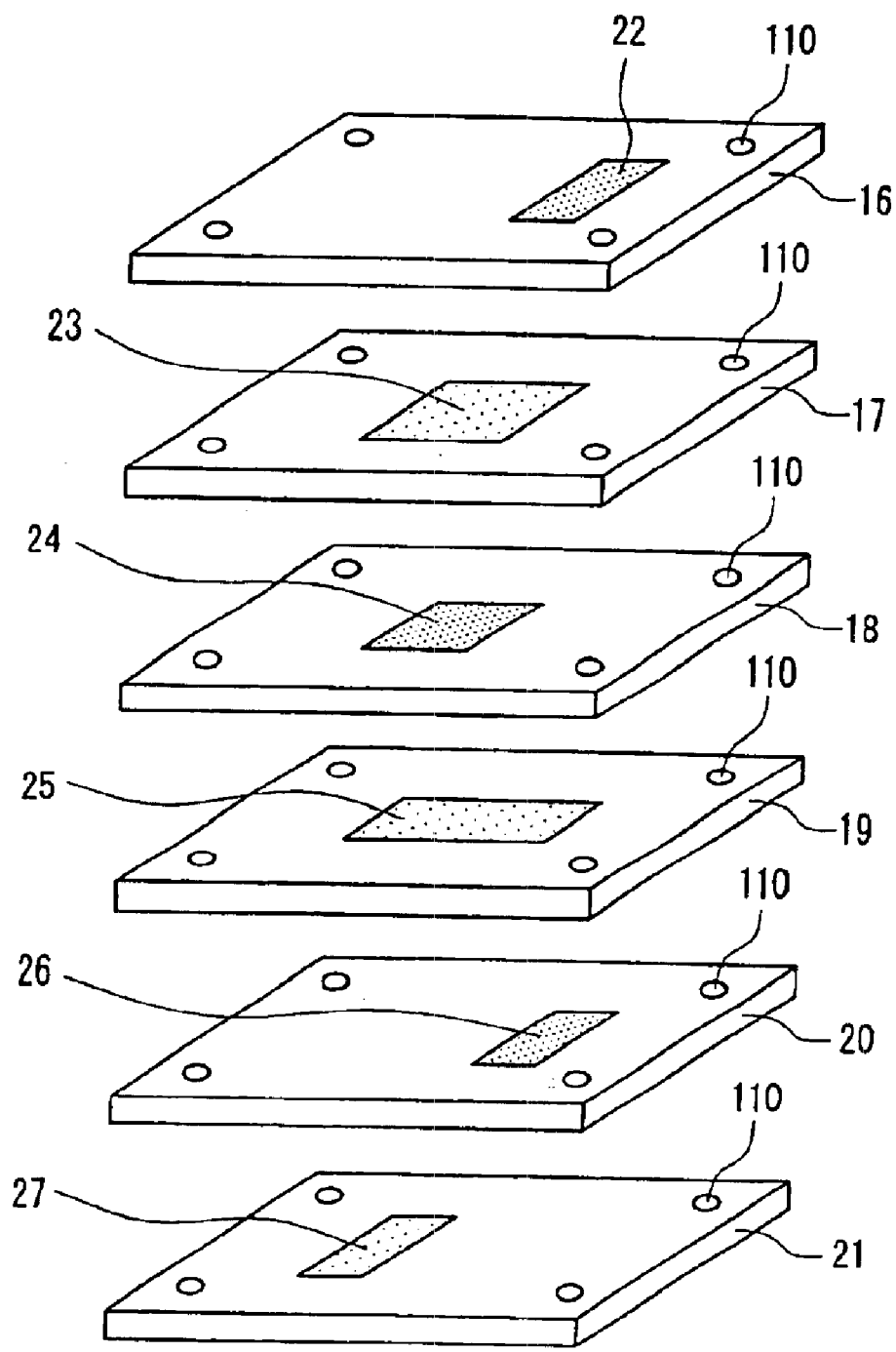
FIG. 18 schematically explains a sheet lamination method for forming the conventional filter.
Figure 19A:
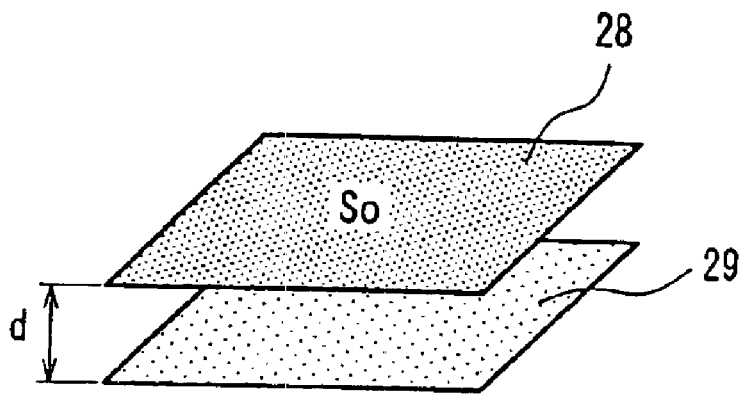
FIGS. 19A to C explain a method for producing the ceramic capacitor according to the first conventional example.
Figure 19B:
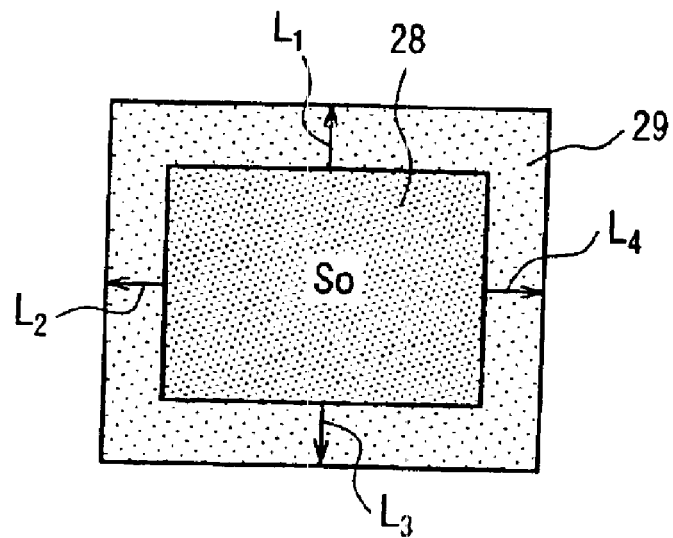
Figure 19C:
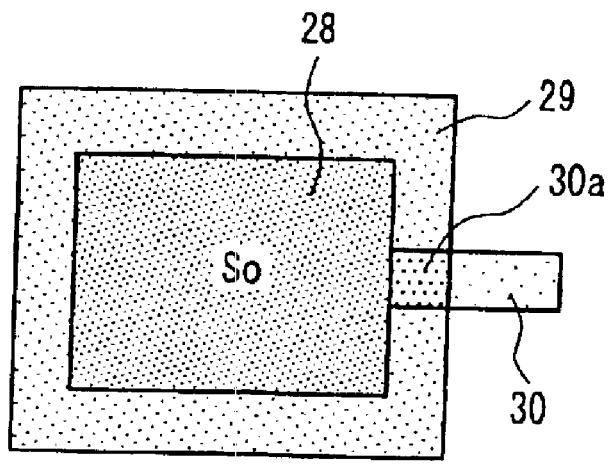
Figure 20A:
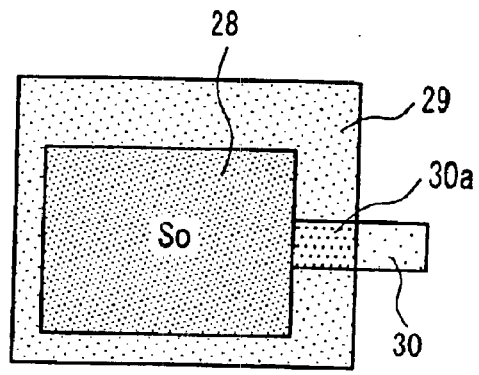
FIGS. 20A to B show problems in the method for producing the ceramic capacitor according to the first conventional example.
Figure 20B:
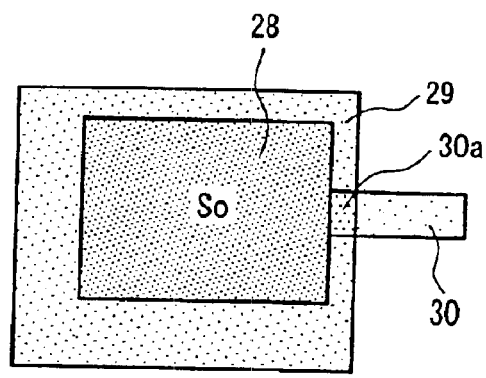
Figure 21A:
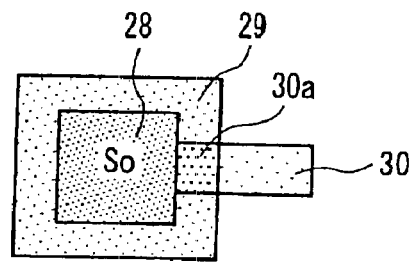
FIGS. 21A to B show problems in a method for producing the ceramic capacitor according to the second conventional example.
Figure 21B:
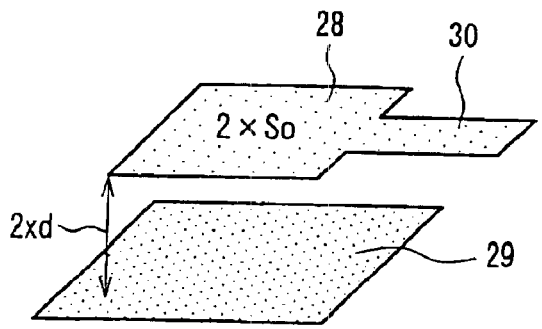

Such a dielectric multilayer device is used, for example, as a low pass filter. The low pass filter, for example, has the equivalent circuit shown in FIG. 17, and is used for a mobile phone having the circuit represented by the block diagram of FIG. 16.

Figure 4:
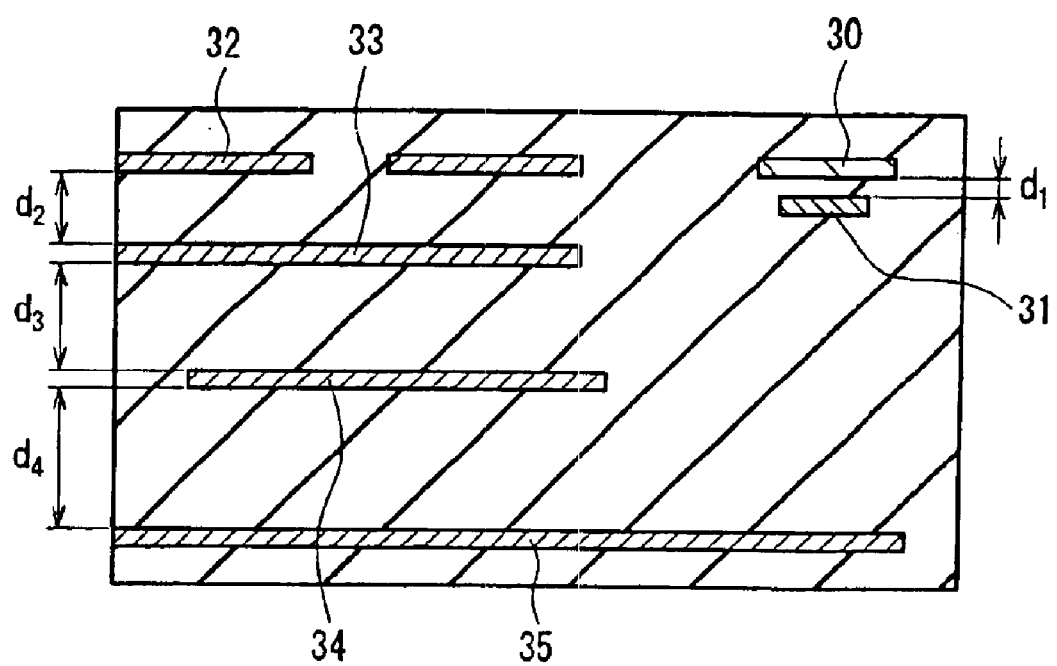
FIG. 4 is a cross-sectional view of a dielectric multilayer device using the ceramic capacitor according to Embodiment 1 of the present invention.

FIG. 4 is a cross-sectional view of the dielectric multilayer device.

As shown in FIG. 4, a capacitor having the first conductive pattern 31 and the second conductive pattern 30 is provided. This capacitor is a ceramic capacitor according to Embodiment 1, indicated by FIGS. 1A to B. This dielectric multilayer device includes another plurality of conductive patterns 32, 33, 34 and 35.

In the dielectric multilayer device according to this embodiment, an interval $d_1$ between the first conductive pattern 31 and the second conductive pattern 30 is made smaller than any thicknesses $d_2$, $d_3$ and $d_4$ of dielectric layers that are sandwiched between the conductive patterns 32, 33, 34 and 35 except for the first and the second conductive patterns 31 and 30. The interval $d_1$ is, for example, 12 $\mu$m.

According to the method for suppressing a variation of this embodiment, the effects can be observed even when the upper electrode and the lower electrode are miniaturized. Therefore, the capacitor of this embodiment is especially effective for applying to a capacitor among elements built into a dielectric multilayer device, the miniaturization of which is desired strongly because the occupying volume of the same tends to be relatively large.

The low pass filter having such a capacitor with a reduced variation in capacitance has stabilized frequency characteristics. In addition, radio equipment with such a low pass filter having stabilized frequency characteristics can exhibit favorable electrical characteristics.

Embodiment 2

Figure 5:
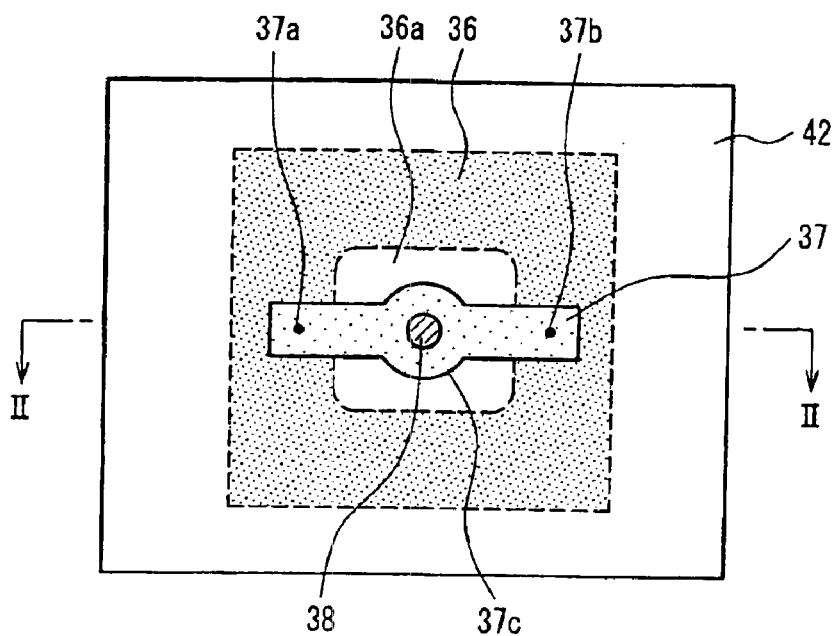
FIG. 5 shows a ceramic capacitor according to Embodiment 2 of the present invention, which is a view projected in a thickness direction of a dielectric layer.
Figure 6:
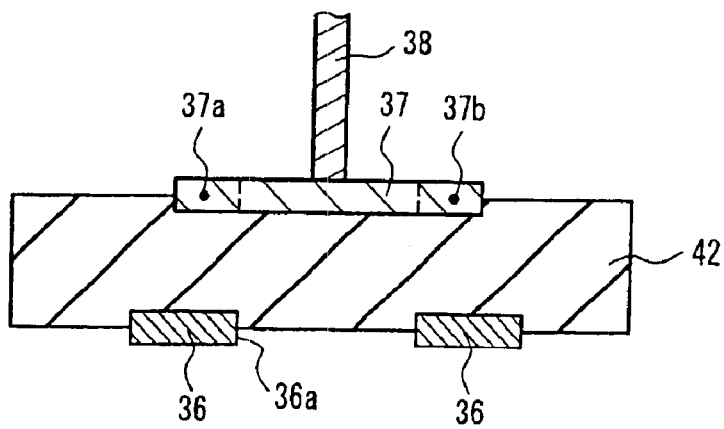
FIG. 6 is a cross-sectional view taken along the line II—II of FIG. 5.

FIG. 5 shows a ceramic capacitor according to Embodiment 2, which is a view projected in a thickness direction of a dielectric layer. FIG. 6 is a cross-sectional view, taken along the line II—II of FIG. 5.

As shown in FIGS. 5 and 6, the ceramic capacitor according to Embodiment 2 is provided with a dielectric layer 42. A first conductive pattern 36 and a second conductive pattern 37 made of a conductor are provided so as to sandwich the dielectric layer 42 therebetween and oppose each other in a thickness direction of the dielectric layer 42. The first conductive pattern 36 is provided with an aperture 36a that penetrates in the same direction as the thickness direction of the dielectric layer 42.

In the projection in the thickness direction of the dielectric layer 42, the second conductive pattern 37 is formed with a strip-shaped pattern whose central portion lies across the aperture 36a and both end portions 37a and 37b overlap the first conductive pattern 36. At a portion of the strip-shaped second conductive pattern 37 that overlaps the aperture 36a of the first conductive pattern 36, the second conductive pattern 37 has a swelling portion 37c with an increased width compared with other portions. The swelling portion 37c is connected with a via electrode 38.

According to the ceramic capacitor of this embodiment, even when a green sheet is displaced during the lamination, for example, the displacement to the right side in the drawing is generated so as to increase an area of the overlapping portion of the end portion 37b with the first conductive pattern 36, an area of the overlapping portion of the end portion 37a with the first conductive pattern 36 is decreased correspondingly. Therefore, even when a green sheet is displaced during the lamination, the total opposed area of the upper electrode (including the end portion 37a and the end portion 37b) and the lower electrode (including the first conductive pattern 36) does not change. As a result, there is no variation in capacitance value due to the displacement in lamination of green sheets.

Note here that even when the green sheet is displaced in the lamination so that the second conductive pattern 37 is rotated in the θ direction, the total opposed area of the upper electrode and the lower electrode does not change.

In addition, the central portion of the second conductive pattern 37 lies over the aperture 36a provided in the first conductive pattern 36, and therefore capacitance is not formed at this portion. Consequently, a low-capacitance capacitor can be realized. Note here that the swelling portion 37c is provided for facilitating the connection with the via electrode 38.

Figure 7:
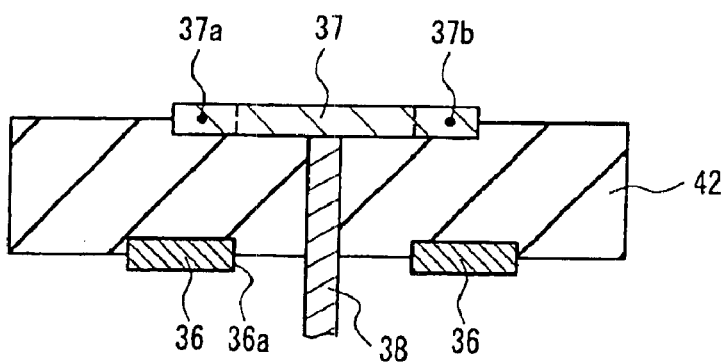
FIG. 7 is a cross-sectional view of another ceramic capacitor according to Embodiment 2 of the present invention.

Note here that although the embodiment shown in FIG. 6 illustrates that the via electrode 38 is led out upwardly from the upper electrode, this embodiment is not limited to such an example. Instead, as shown in FIG. 7, the via electrode 38 may be provided downwardly so as to penetrate through the aperture 36a of the first conductive pattern 36.

Figure 8:
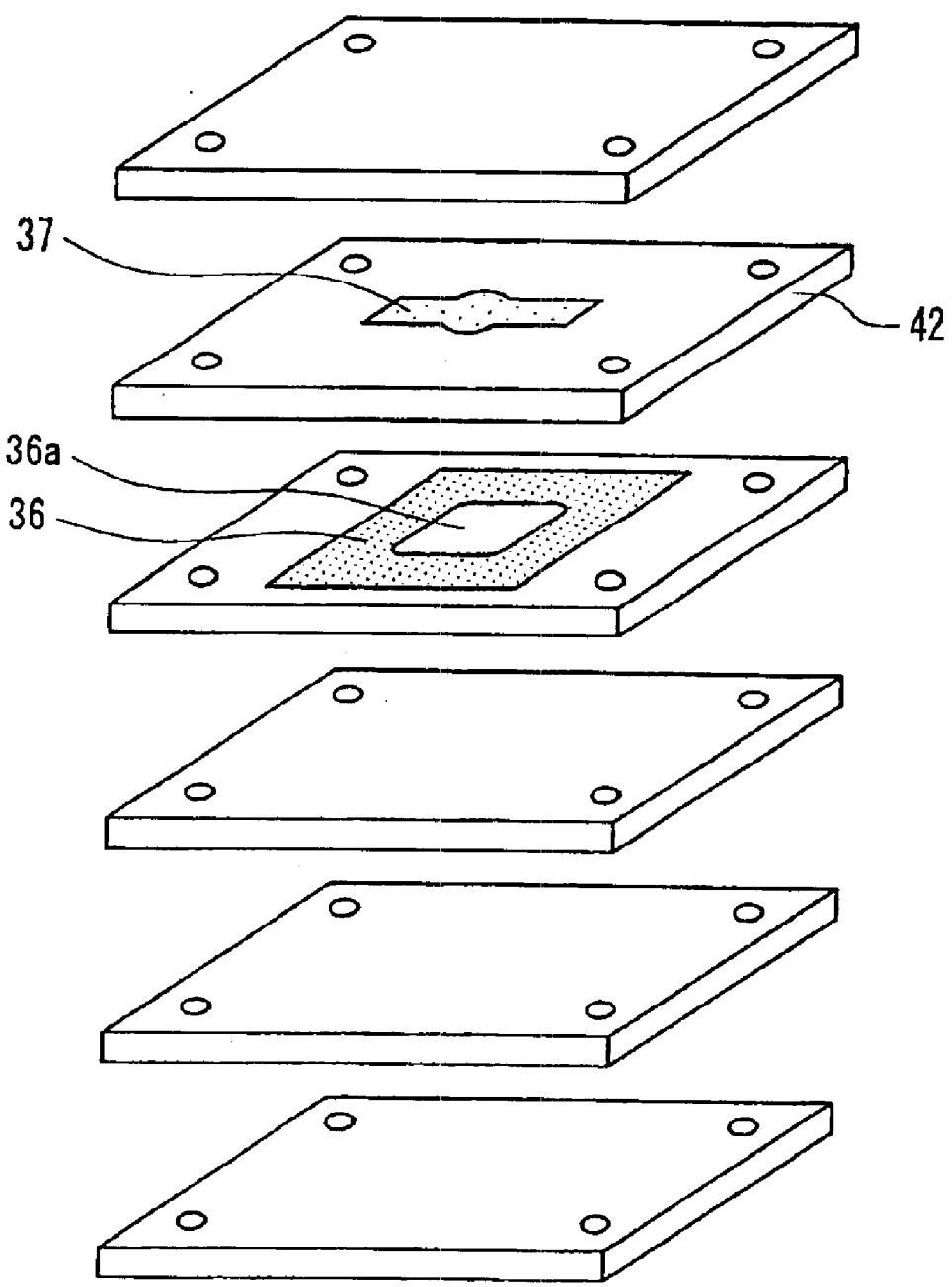
FIG. 8 schematically explains a method for producing the ceramic capacitor according to Embodiment 2 of the present invention.

FIG. 8 schematically explains a method for producing the ceramic capacitor according to Embodiment 2.

Each of green sheets has a conductive pattern (not illustrated) formed thereon. A green sheet 42 corresponds to the dielectric layer 42 shown in FIG. 6.

The feature of this method resides in that the aperture 36a is formed in the first conductive pattern 36 so as to penetrate in the same direction as the thickness direction of the dielectric layer 42 and, in the projection in the thickness direction, the second conductive pattern 37 is formed with a strip-shaped pattern whose central portion lies across the aperture 36a and both end portions overlap the first conductive pattern 36.

According to this method, even when the green sheet is displaced during the lamination, there is no variation generated in the capacitance value as stated above. Since a variation can be suppressed even when the upper electrode and the lower electrode are miniaturized, this embodiment is effective for producing a low-capacitance capacitor, the miniaturization of which is inevitable.

Embodiment 3

Figure 9:
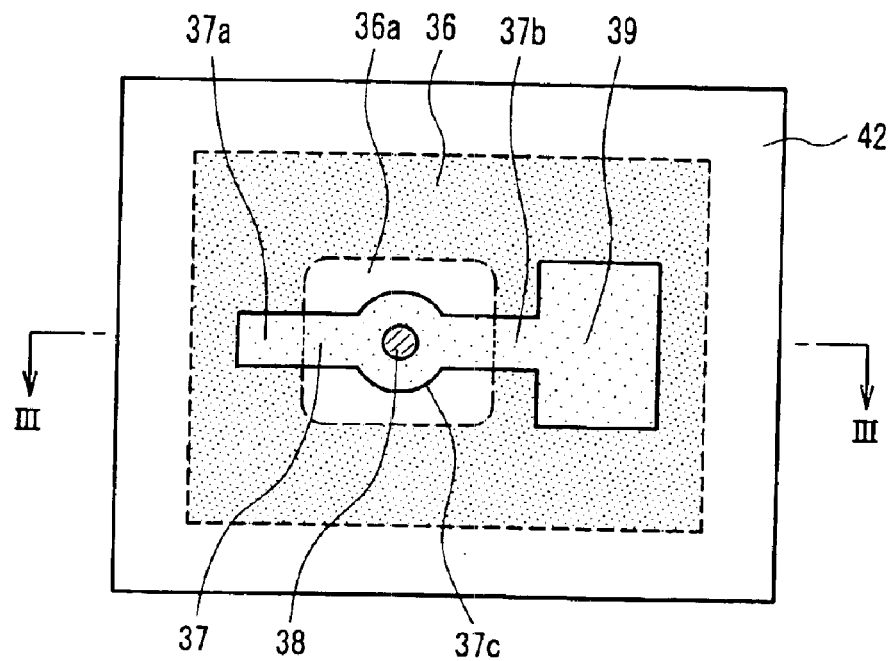
FIG. 9 shows a ceramic capacitor according to Embodiment 3 of the present invention, which is a view projected in a thickness direction of a dielectric layer.
Figure 10:
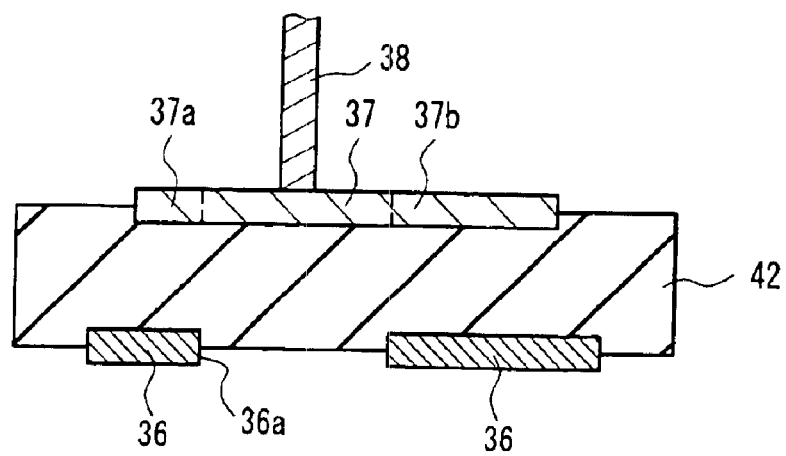
FIG. 10 is a cross-sectional view taken along the line III—III of FIG. 9.

FIG. 9 shows a ceramic capacitor according to Embodiment 3, which is a view projected in a thickness direction of a dielectric layer. FIG. 10 is a cross-sectional view, taken along the line III—III of FIG. 9.

Except for the following aspects, the ceramic capacitor according to Embodiment 3 is similar to the ceramic capacitor according to Embodiment 2. Therefore, the same reference numerals will be assigned to the same or corresponding elements, and their explanations will not be repeated. In FIGS. 9 and 10, reference numeral 37 denotes a main part of a second conductive pattern (simply referred to as a second conductive pattern also), 37a and 37b are extended portions of the same, and 37c denotes a swelling portion located at the center of the second conductive pattern 37.

The ceramic capacitor according to Embodiment 3 is different from the ceramic capacitor according to Embodiment 2 in that, as shown in FIG. 9, a third conductive pattern 39 is formed integrally at one end portion of the second conductive pattern 37, which overlaps a first conductive pattern 36 via a dielectric layer so as to form capacitance. Also in the configuration of this embodiment, there is no variation generated by the displacement in lamination of green sheets. Note here that the third conductive pattern 39 may be formed not only at the one end portion of the second conductive pattern 37 but also at both end portions, which exerts the similar effects.

Additionally, although the embodiment shown in FIG. 10 illustrates that a via electrode 38 is led out upwardly from the upper electrode, this embodiment is not limited to such an example. Instead, the via electrode 38 may be provided downwardly so as to penetrate through an aperture 36a of the first conductive pattern 36.

Although the strip-shaped pattern in the ceramic capacitor according to Embodiment 2 has bilateral symmetry in the drawing, this embodiment is advantageous because there is no need to form the strip-shaped pattern with bilateral symmetry. In addition, according to the ceramic capacitor of this embodiment, the capacitance of the capacitor can be controlled by adjusting an area of the third conductive pattern 39.

The above-described embodiment exemplifies a low pass filter as the application example of the dielectric multilayer device. However, this embodiment is not limited to such an example, and the application of this embodiment to a high pass filter, a band pass filter, a band elimination filter and a module with a combination of some of these filters can exert the similar effects.

EXAMPLES

The following describes examples of the present invention, with reference to the drawings. The present invention is not limited to the following examples.

Example 1

This example is intended to experimentally confirm the effects of the invention according to Embodiment 1.

Figure 11A:
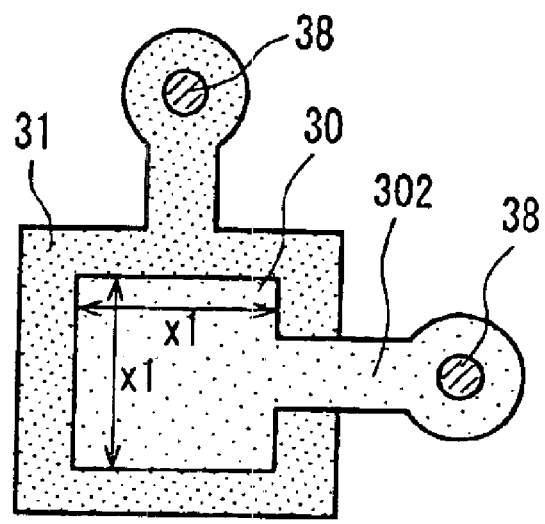
FIG. 11A shows a ceramic capacitor according to a comparative example, which is a view projected in a thickness direction of a dielectric layer.

FIG. 11A shows a ceramic capacitor according to a comparative example, which is a view projected in a thickness direction of a dielectric layer. The ceramic capacitor according to the comparative example has a first conductive pattern 31 and a second conductive pattern 30, and the second conductive pattern 30 is provided with an extended portion 302 at only one edge.

Figure 11B:
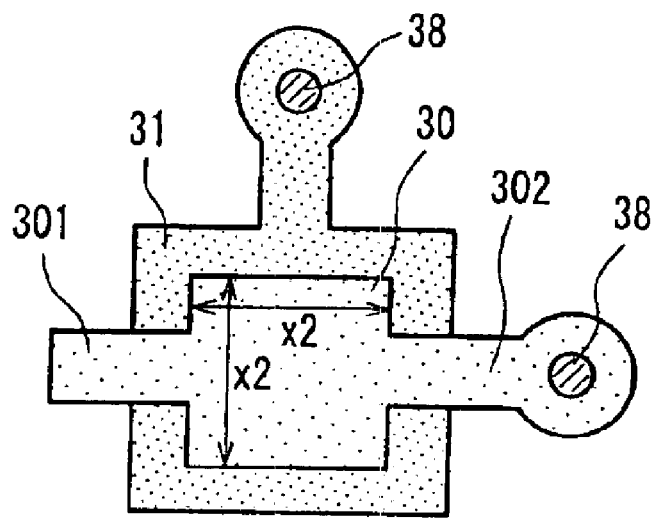
FIG. 11B shows a ceramic capacitor according to Example 1, which is a view projected in a thickness direction of a dielectric layer.

FIG. 11B shows a ceramic capacitor according to Example 1, which is a view projected in a thickness direction of a dielectric layer. The ceramic capacitor according to Example 1 has a first conductive pattern 31 and a second conductive pattern 30, and the second conductive pattern 30 includes at both edges a first extended portion 301 and a second extended portion 302 that extend in mutually opposite directions. The first extended portion 301 and the second extended portion 302 stick out from an outer edge of the first conductive pattern 31.

Figure 12:
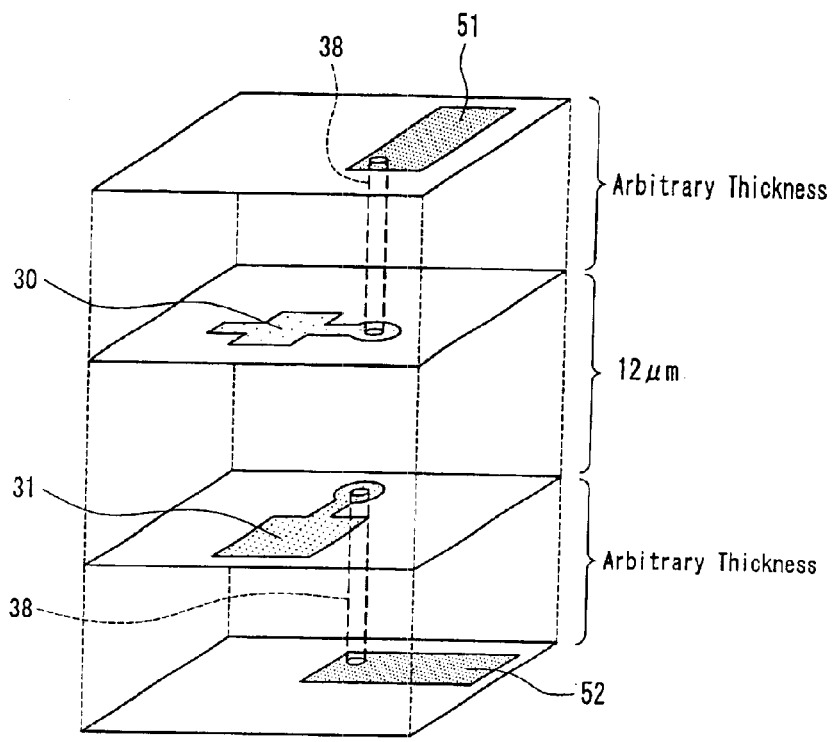
FIG. 12 schematically explains a method for producing measurement samples by a sheet lamination method.

Measurement samples were formed by the sheet lamination method shown in FIG. 12.

That is to say, above and below two green sheets serving as a ceramic capacitor, a green sheet with an electrode pattern 51 for measurement applied thereon and a green sheet with an electrode pattern 52 for measurement applied thereon, respectively, were laminated. The connection between the electrode pattern 51 for measurement and the second conductive pattern 30 and the connection between the electrode pattern 52 for measurement and the first conductive pattern 31 were made by via electrodes 38. A thickness of a dielectric layer provided between the electrode pattern 51 for measurement and the second conductive pattern 30 and a thickness of a dielectric layer provided between the electrode pattern 52 for measurement and the first conductive pattern 31 were set arbitrarily.

In both of the comparative example and this example, a dielectric with a relative dielectric constant of 7.4 was used as the dielectric layer. An interval between the first conductive pattern 31 and the second conductive pattern 30 (the thickness of the dielectric layer) was set at 12 μm, which was a value after sintering.

As for both of the comparative example and this example, five target capacitance values were set, and capacitance values of 100 samples for each were measured, where evaluation was conducted by regarding three times the standard deviation (σ) as a variation in capacitance value. The above-stated five target capacitance values were designed by changing an area of the square conductive pattern 30 ($x_1 \times x_1$ in the case of the conventional example, $x_2 \times x_2$ in the case of this example) with consideration given also to the addition of the areas of the extended portions 301 and 302. The widths of the extended portions 301 and 302 were made constant at 150 μm.

Figure 13:
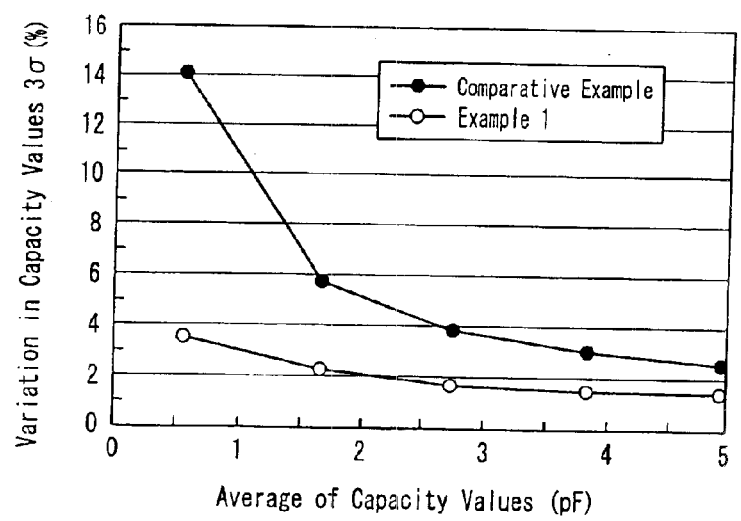
FIG. 13 shows a relationship between a variation $3\sigma$ in capacitance value and an average of capacitance values (pF) in Example 1 of the present invention.

FIG. 13 shows a graph where a variation 3σ in capacitance value is on the vertical axis and an average of the capacitance values (pF) is on the horizontal axis based on the obtained measurement results.

As is evident from FIG. 13, as compared with the comparative example, this example had an extremely reduced variation in capacitance value.

Note here that the capacitance values fluctuate also with a variation in shape of the conductive pattern during printing and a variation in thickness of the dielectric layer, and therefore, even after the influence of the displacement in lamination is removed as in this example, the capacitance values vary to some extent.

Example 2

In this example, the effects of the invention according to Embodiment 2 were confirmed experimentally.

Figure 14A:
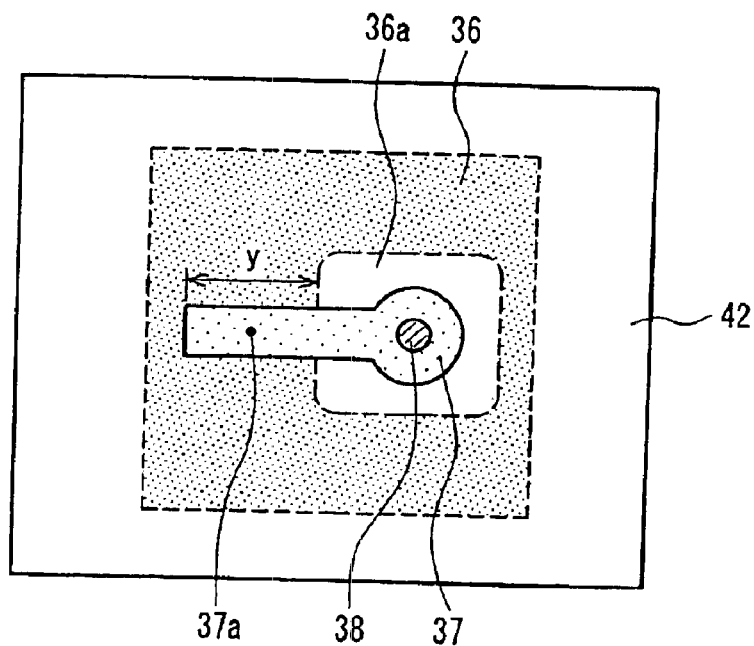
FIG. 14A shows a ceramic capacitor according to a comparative example, which is a view projected in a thickness direction of a dielectric layer.

FIG. 14A shows a ceramic capacitor according to a comparative example, which is a view projected in a thickness direction of a dielectric layer. The ceramic capacitor according to the comparative example includes a first conductive pattern 36 and a second conductive pattern 37. In the first conductive pattern 36, an aperture 36a is provided. The second conductive pattern 37 is formed with a strip-shaped pattern, only one end portion of which overlaps the first conductive pattern 36. A length of the overlapping portion 37a is set at y.

Figure 14B:
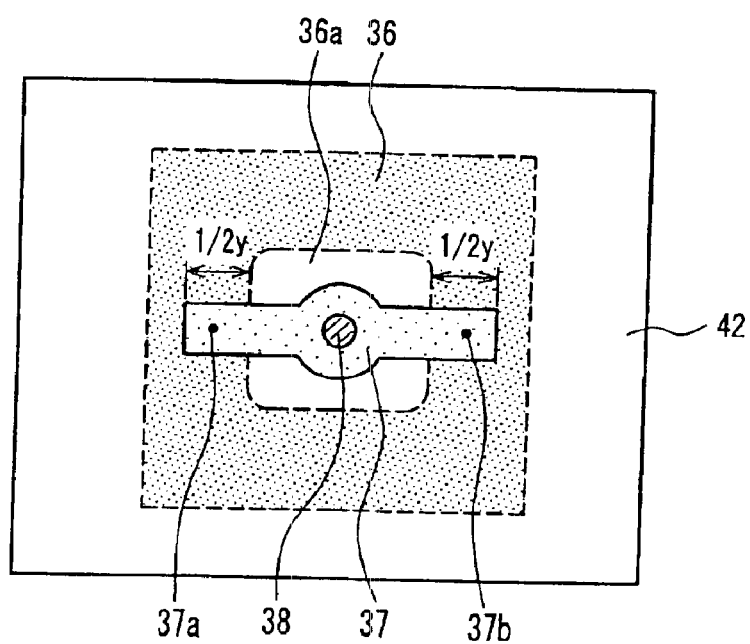
FIG. 14B shows a ceramic capacitor according to Example 2, which is a view projected in a thickness direction of a dielectric layer.

FIG. 14B shows a ceramic capacitor according to Example 2, which is a view projected in a thickness direction of a dielectric layer. The ceramic capacitor according to Example 2 includes a first conductive pattern 36 and a second conductive pattern 37. In the first conductive pattern 36, an aperture 36a is provided. The second conductive pattern 37 is formed with a strip-shaped pattern, both end portions of which overlap the first conductive pattern 36. A length of each of the overlapping portions 37b is set at y/2.

Similarly to Example 1, measurement samples were formed by the sheet lamination method shown in FIG. 12. The formation of electrode patterns for measurement and the like were conducted under the conditions similar to Example 1.

As for both of the comparative example and this example, five target capacitance values were set, and capacitance values of 100 samples for each were measured, where evaluation was conducted by regarding three times the standard deviation (σ) as a variation in capacitance value. The above-stated five target capacitance values were designed by changing the length of the overlapping portion of the strip-shaped pattern 37 and the first conductive pattern 36 (y in the case of the conventional example, ½y in the case of this example). The width of the strip-shaped pattern 37 was made constant at 150 μm.

Figure 15:
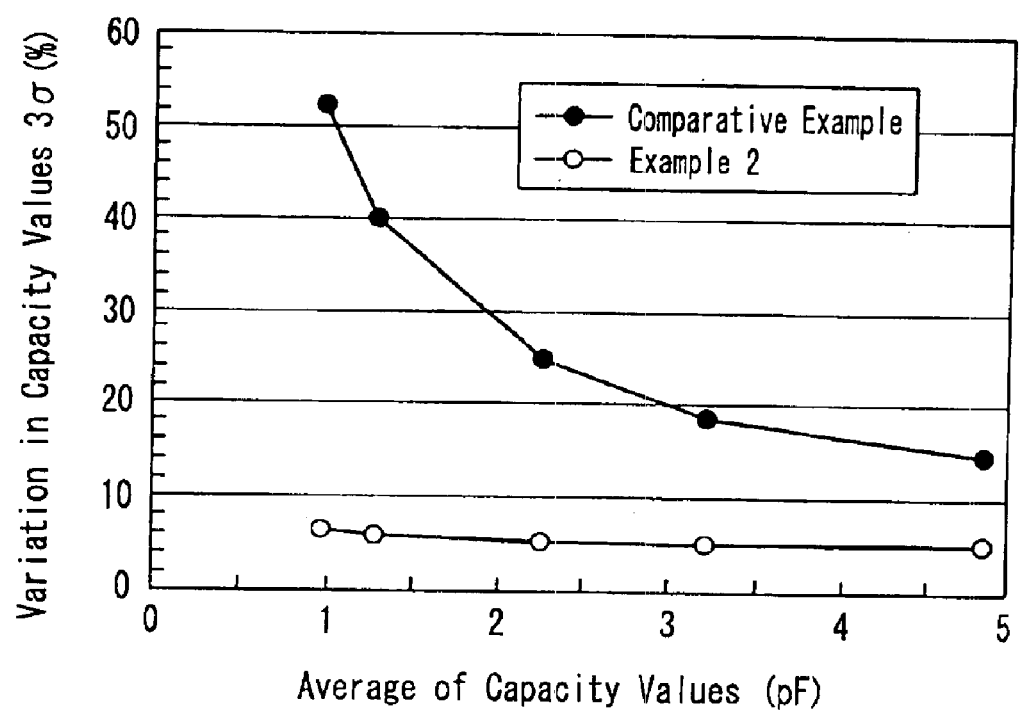
FIG. 15 shows a relationship between a variation $3\sigma$ in capacitance value and an average of capacitance values (pF) in Example 2.

FIG. 15 shows a graph where a variation 3σ in capacitance value is on the vertical axis and an average of the capacitance values (pF) is on the horizontal axis based on the obtained measurement results.

As is evident from FIG. 15, as compared with the comparative example, this example had an extremely reduced variation in capacitance value.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A ceramic capacitor, comprising: a first conductive pattern; a second conductive pattern and a dielectric layer, the first conductive pattern and the second conductive pattern being made of a conductor and provided so as to oppose each other and sandwich the dielectric layer therebetween, the first conductive pattern and the second conductive pattern being different in area from each other, where the second conductive pattern is smaller than the first conductive pattern, and a portion where the first conductive pattern and the second conductive pattern overlap each other forming a capacitance portion, wherein a first extended portion and a second extended portion made of the conductor are formed at both edges of the second conductive pattern so as to extend in mutually opposite directions, and the first conductive Pattern has an aperture.

2. The ceramic capacitor according to claim 1, wherein an outer edge of the second conductive pattern is formed so as not to extend beyond an outer edge of the first conductive pattern.

3. The ceramic capacitor according to claim 1, wherein the first extended portion and the second extended portion of the second conductive pattern extend outwardly beyond an outer edge of the first conductive pattern.

4. The ceramic capacitor according to claim 1, wherein a width of each of the first extended portion and the second extended portion of the second conductive pattern is narrower than a width of the first conductive pattern.

5. The ceramic capacitor according to claim 1, wherein the second conductive pattern does not have an aperture.

6. The ceramic capacitor according to claim 1, wherein the second conductive pattern is formed with a strip-shaped pattern whose central portion lies across the aperture of the first conductive pattern and both end portions overlap the first conductive pattern.

7. The ceramic capacitor according to claim 6, wherein the second conductive pattern formed in the strip shape has a swelling portion at an overlapping portion with the aperture of the first conductive pattern, the swelling portion having an increased width compared with other portions and for the connection with a via electrode.

8. The ceramic capacitor according to claim 6, wherein a third conductive pattern further is formed integrally at least at one end portion of the second conductive pattern, the third conductive pattern overlapping the first conductive pattern so as to form capacitance.

9. The ceramic capacitor according to claim 1, wherein the first extended portion and the second extended portion of the second conductive pattern have a same width.

10. The ceramic capacitor according to claim 1, wherein the first extended portion and the second extended portion of the second conductive pattern are present along a same line.

11. The ceramic capacitor according to claim 1, wherein the first extended portion and the second extended portion of the second conductive pattern are present in parallel lines.

12. A method for producing a ceramic capacitor, comprising the steps of:

forming a first conductive pattern serving as one electrode of the capacitor on a first green sheet;

forming a second conductive pattern serving as the other electrode of the capacitor on a second green sheet; and laminating the first green sheet and the second green sheet, followed by sintering of the same, wherein an aperture is formed in the first conductive pattern so as to penetrate in a same direction as a direction of the lamination, and in projection in the lamination direction, the second conductive pattern is formed with a strip-shaped pattern whose central portion lies across the aperture and both end portions overlap the first conductive pattern.

13. A dielectric multilayer device, comprising: a plurality of dielectric layers and a plurality of conductive patterns, which are laminated alternately in a vertical direction having an interval therebetween; and a capacitor that is built in the dielectric multilayer device, wherein the capacitor comprises: a first dielectric layer; and a first conductive pattern and a second conductive pattern made of a conductor provided so as to oppose each other and sandwich the first dielectric layer therebetween in a direction of a thickness of the first dielectric layer, an aperture is formed in the first conductive pattern so as to penetrate in a same direction as the direction of the thickness of the first dielectric layer, and in projection in the thickness direction, the second conductive pattern is formed with a strip-shaped pattern whose central portion lies across the aperture and both end portions overlap the first conductive pattern.

14. The dielectric multilayer device according to claim 13, wherein the first dielectric layer constituting the capacitor is formed thinner than any dielectric layers sandwiched between conductive patterns other than the first and the second conductive patterns.

* * * * *